(12) United States Patent
Sugimura et al.

(10) Patent No.: US 10,121,767 B2
(45) Date of Patent: Nov. 6, 2018

(54) SEMICONDUCTOR STORAGE DEVICE AND MANUFACTURING METHOD THEREOF

(71) Applicant: Toshiba Memory Corporation, Minato-ku (JP)

(72) Inventors: Misa Sugimura, Yokohama (JP); Akihiro Iida, Kamakura (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/062,368

(22) Filed: Mar. 7, 2016

(65) Prior Publication Data

US 2017/0077065 A1    Mar. 16, 2017

Related U.S. Application Data

(60) Provisional application No. 62/216,779, filed on Sep. 10, 2015.

(51) Int. Cl.

| H01L 29/49 | (2006.01) |
| H01L 25/065 | (2006.01) |
| H01L 23/544 | (2006.01) |
| H01L 23/31 | (2006.01) |
| H01L 25/00 | (2006.01) |
| H01L 23/00 | (2006.01) |
| H01L 25/18 | (2006.01) |

(52) U.S. Cl.
CPC ...... *H01L 25/0657* (2013.01); *H01L 23/3121* (2013.01); *H01L 23/544* (2013.01); *H01L 24/32* (2013.01); *H01L 24/48* (2013.01); *H01L 24/49* (2013.01); *H01L 24/73* (2013.01); *H01L 24/92* (2013.01); *H01L 25/18* (2013.01); *H01L 25/50* (2013.01); *H01L 2223/54406* (2013.01); *H01L 2223/54433* (2013.01); *H01L 2223/54486* (2013.01); *H01L 2224/04042* (2013.01); *H01L 2224/32145* (2013.01); *H01L 2224/32225* (2013.01); *H01L 2224/48145* (2013.01); *H01L 2224/48227* (2013.01); *H01L 2224/49175* (2013.01); *H01L 2224/73265* (2013.01); *H01L 2224/92247* (2013.01); *H01L 2225/0651* (2013.01); *H01L 2225/06506* (2013.01); *H01L 2924/1434* (2013.01); *H01L 2924/19041* (2013.01); *H01L 2924/19105* (2013.01); *H01L 2924/37001* (2013.01)

(58) Field of Classification Search
CPC .......................... H01L 25/0657; H01L 21/56
See application file for complete search history.

(56) References Cited

U.S. PATENT DOCUMENTS 7,732,908 B2 * 6/2010 Nishiyama .......... H01L 23/3121
                                                                            257/686
7,944,037 B2 * 5/2011 Nishiyama .......... H01L 23/3121
                                                                            257/686

(Continued)

*Primary Examiner* — Michael Shingleton
(74) *Attorney, Agent, or Firm* — Oblon, McClelland, Maier & Neustadt, L.L.P.

(57) ABSTRACT

A semiconductor storage device of the present embodiments includes a substrate, a first semiconductor chip and a sealer. The substrate has wirings. The first semiconductor chip is connected to the wirings on the substrate. The sealer has a first surface, which does not face a top surface of the first semiconductor chip and is provided with a mark, and seals the first semiconductor chip.

12 Claims, 4 Drawing Sheets

(56) References Cited

U.S. PATENT DOCUMENTS

| | | | |
|---|---|---|---|
| 7,989,960 B2* | 8/2011 | Shinohara | G11C 5/02 257/686 |
| 2008/0316696 A1* | 12/2008 | Nishiyama | H01L 24/49 361/679.31 |
| 2009/0057723 A1* | 3/2009 | Kaneko | H01L 23/62 257/209 |
| 2011/0101110 A1* | 5/2011 | Nishiyama | G06K 19/07732 235/492 |
| 2011/0198740 A1* | 8/2011 | Matsushima | H01L 23/49531 257/668 |
| 2011/0316134 A1* | 12/2011 | Ishii | H01L 23/3107 257/676 |
| 2013/0069223 A1* | 3/2013 | Chen | H01L 25/18 257/737 |
| 2013/0186960 A1* | 7/2013 | Suzuki | G06K 19/07732 235/492 |
| 2017/0077065 A1* | 3/2017 | Sugimura | H01L 25/0657 |

* cited by examiner

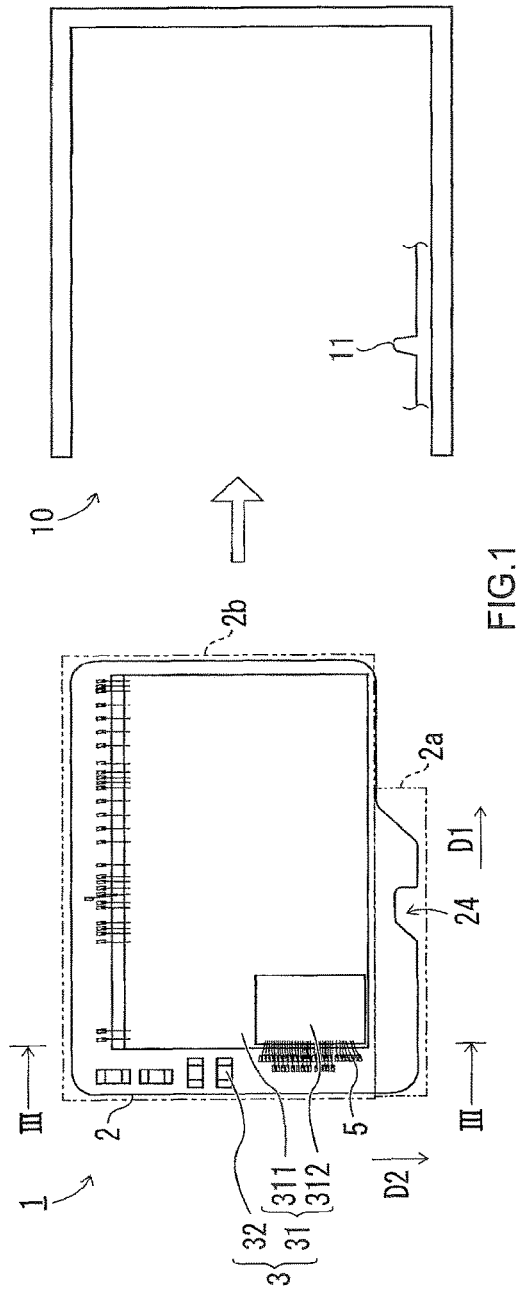
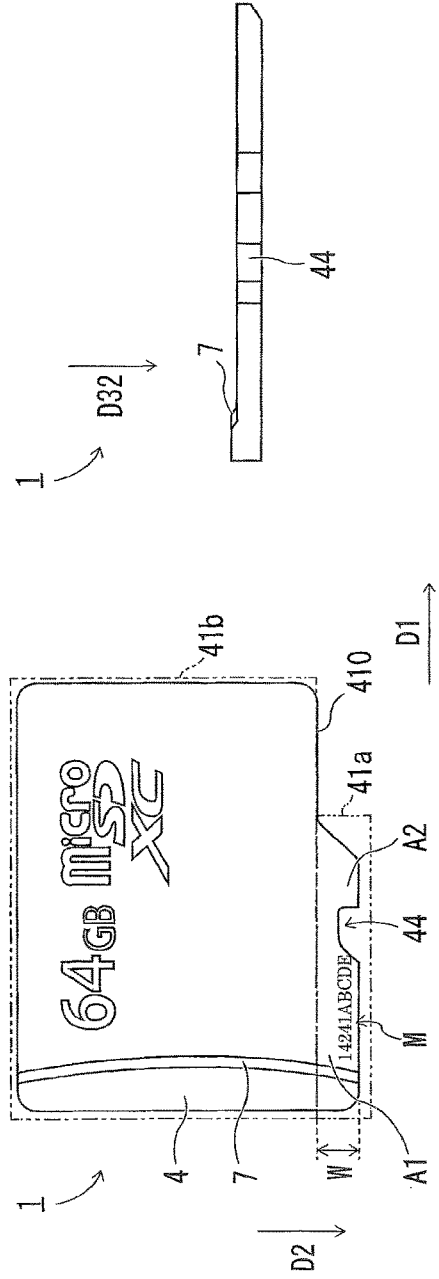
FIG.1
FIG.2A
FIG.2B

SEMICONDUCTOR STORAGE DEVICE AND MANUFACTURING METHOD THEREOF

CROSS REFERENCE TO RELATED APPLICATIONS

This application is based upon and claims the benefit of priority from the prior U.S. Provisional Patent Application No. 62/216,779 filed on Sep. 10, 2015, the entire contents of which are incorporated herein by reference.

FIELD

The present embodiments relate to a semiconductor storage device and a manufacturing method thereof.

BACKGROUND

A memory card includes, for example, a substrate, electronic components, such as a NAND chip, a controller chip and a passive component, that is mounted on the substrate and a molded resin that seals the electronic components.

BRIEF DESCRIPTION OF THE DRAWINGS

FIG. 1. is a plan view of an inside of a semiconductor storage device showing a first embodiment;

FIG. 2A is a plan view of the semiconductor storage device showing the first embodiment, and FIG. 2B is a side view of the semiconductor storage device;

DETAILED DESCRIPTION

The semiconductor storage device of the present embodiments includes a substrate, a first semiconductor chip and a sealer. The substrate has wirings. The first semiconductor chip is connected to the wirings on the substrate. The sealer has a first surface, which does not face a top surface of the first semiconductor chip and is provided with a mark, and seals the first semiconductor chip.

Embodiments will now be explained with reference to the accompanying drawings. The present invention is not limited to the embodiments.

(First Embodiment)

Figure 3:
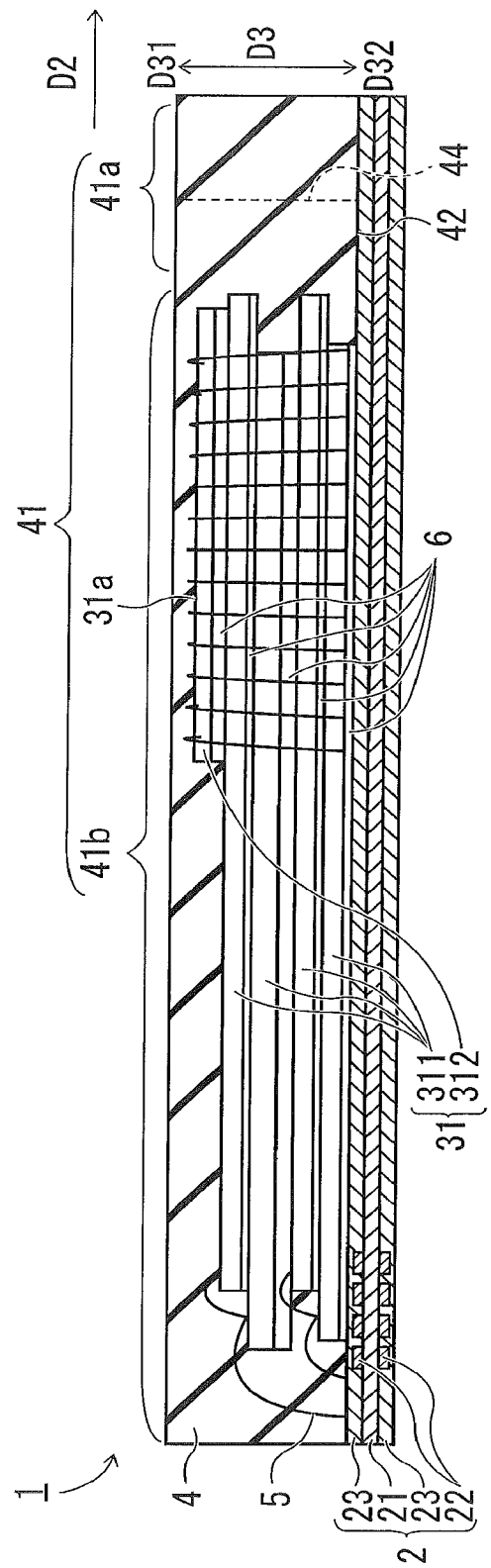
FIG. 3 is a schematic cross sectional view of the semiconductor storage device showing the first embodiment.

FIG. 1 is a plan view of an inside of a semiconductor storage device 1 showing a first embodiment. Note that, in FIG. 1, a socket 10 of a host device (an external appliance) was also shown for convenience of description. The socket 10 has a function of fastening the semiconductor storage device 1 when being inserted. FIG. 2A is a plan view of the semiconductor storage device 1 showing the first embodiment. FIG. 2B is a side view of the semiconductor storage device 1. FIG. 3 is a schematic cross sectional view of the semiconductor storage device 1 showing the first embodiment. FIG. 3 is a III-III cross sectional view of FIG. 1.

The semiconductor storage device 1 of the first embodiment is, for example, a memory card, such as an SD card. As shown in FIG. 3, the semiconductor storage device 1 of the first embodiment includes a circuit board 2, namely, a printed wiring board, which is an example of a substrate, electronic components 3 and a sealer 4.

As shown in FIG. 3, the circuit board 2 includes a core material 21, wirings 22 formed on a front side and a back side of the core material 21 and insulating films 23 that cover the front side and the back side of the core material 21. Note that, in FIG. 3, merely a part of the wirings 22 is schematically shown. The core material 21 may be, for example, a glass-reinforced epoxy substrate. The wirings 22 may be, for example, Cu wirings. The insulating film 23 may be, for example, a solder resist.

As shown in FIG. 1, the circuit board 2 has a first substrate section 2a and a second substrate section 2b.

The first substrate section 2a has a plane area smaller than the second substrate section 2b. The first substrate section 2a extends in an inserting direction D1 of the semiconductor storage device 1 into the socket 10. As shown in FIG. 2A, at an end portion in a side direction D2 orthogonal to the inserting direction D1, the first substrate section 2a extends in the side direction D2 from the second substrate section 2b. In the first substrate section 2a, there is a recessed section 24, namely, a notch. The recessed section 24 is used for fastening the semiconductor storage device 1 to the socket 10 (the host device) when the semiconductor storage device 1 is inserted into the socket 10. Note that, the recessed section 24 may be fitted over a protrusion-like elastic section 11 provided to the socket 10 (refer to FIG. 1). On the first substrate section 2a, the electronic components are not mounted.

The second substrate section 2b has substantially a rectangular shape in a planar view. On the second substrate section 2b, the electronic components 3 are mounted.

As shown in FIGS. 1 and 3, the electronic components 3 include a laminated chip 31, which is an example of the first semiconductor chip, and a passive component 32.

The laminated chip 31 is formed by laminating a plurality of semiconductor chips in a thickness direction D3 of the circuit board 2. Specifically, as shown in FIG. 3, the laminated chip 31 includes a NAND chip 311 of plural layers (four layers), which is an example of a memory chip, and a controller chip 312 of a single layer arranged above the NAND chip 311. Note that the semiconductor storage device 1 may include a memory chip other than the NAND chip 311. The controller chip 312 controls operations of the NAND chip 311. The semiconductor chips 311 and 312 or the semiconductor chip 311 and the second substrate section 2b, which are vertically adjacent to each other, are bonded with a bonding agent 6. The bonding agent 6 may be, for example, a die attach film (DAF).

The passive component 32 is mounted in a region other than a mounting region of the laminated chip 31 in the second substrate section 2b. The passive component 32 may be, for example, a condenser.

Each of the NAND chip 311, the controller chip 312 and the passive component 32 is electrically connected to the wirings 22 of the circuit board 2 via a wire 5 and a not-shown connecting pad.

The sealer 4 is, for example, a molded resin. As shown in FIG. 2A, the sealer 4 has the same shape as the circuit board 2 in a planar view.

As shown in FIGS. 2A and 3, a top surface 41 of the sealer 4 has a first surface 41a and a second surface 41b.

The first surface 41a is overlaid on the first substrate section 2a in the thickness direction D3. Specifically, as shown in FIG. 2A, the first surface 41a extends in the inserting direction D1. Moreover, in the first surface 41a, there is a recessed section 44 that overlays on the recessed section 24 of the first substrate section 2a.

The second surface 41b is overlaid on the second substrate section 2b in the thickness direction D3. Specifically, the second surface 41b has substantially a rectangular shape in a planar view.

As shown in FIG. 3, the second surface 41b faces a top surface 31a of the laminated chip 31 in proximity to an upper side D31.

The first surface 41a is connected to the second surface 41b so as not to face the top surface 31a of the laminated chip 31. Specifically, the first surface 41a extends in the side direction D2 from an end section 410 of the second surface 41b to be positioned in a direction orthogonal to the thickness direction D3 with respect to the laminated chip 31. According to SD standards, the dimension W of the side direction D2 of the first surface 41a is, in the case of the micro SD memory card, 1.5 mm at the maximum. The recessed section 44 is used for fastening the semiconductor storage device 1 to the socket 10 together with the recessed section 24 of the first substrate section 2a.

The first surface 41a has a first region A1 and a second region A2 sandwiching the recessed section 44. The first region A1 is formed larger than the second region A2 in the inserting direction D1.

As shown in FIG. 2A, in the first region A1 of the first surface 41a, a laser mark M formed by laser irradiation is provided as an example of the mark. In the first region A1, not only a laser mark having a relatively small number of characters, such as a logotype, but also a laser mark having a relatively large number of characters, such as a traceability code, can be formed. In the second region A2, a laser mark having a relatively small number of characters can be formed.

For making the thickness of the semiconductor storage device 1 satisfy the standards (SD standards) while mounting the laminated chip 31, which is thick and large-capacity, the sealer 4 on the laminated chip 31 is made relatively thin. In the case where the laser mark M is provided to the second surface 41b, due to the thin sealer 4, there is a possibility that the laser penetrates the sealer 4, to thereby cause damage to the laminated chip 31. Moreover, even in the case where a laser mark M is formed on a terminal surface of the circuit board 2 before sealing the electronic components 3 by the sealer 4, there is a possibility of causing damage to the wirings, or a possibility of causing Cu corrosion by exposing Cu patterns.

In contrast thereto, in the first embodiment, the laser mark M is provided, not to the second surface 41b or a terminal surface, but to the second surface 41b that does not face the top surface 31a of the laminated chip 31. This can avoid the damage to the laminated chip 31 or wirings caused by formation of the laser mark M.

As shown in FIGS. 2A and 2B, the sealer 4 may include an inclined surface 7 over the first surface 41a and the second surface 41b. The inclined surface 7 has substantially an arc shape in a planar view, and is inclined toward a lower side D32 with movement to the inserting direction D1 in the side view. The inclined surface 7 may prevent the semiconductor storage device 1 from being excessively inserted into the socket 10 by butting the socket 10.

According to the semiconductor storage device 1 of the first embodiment, even if the laser mark M is formed in the semiconductor storage device 1 of large capacity, for example, 64 GB or more, it is possible to secure characteristics and reliability of the semiconductor storage device 1.

Figure 4:
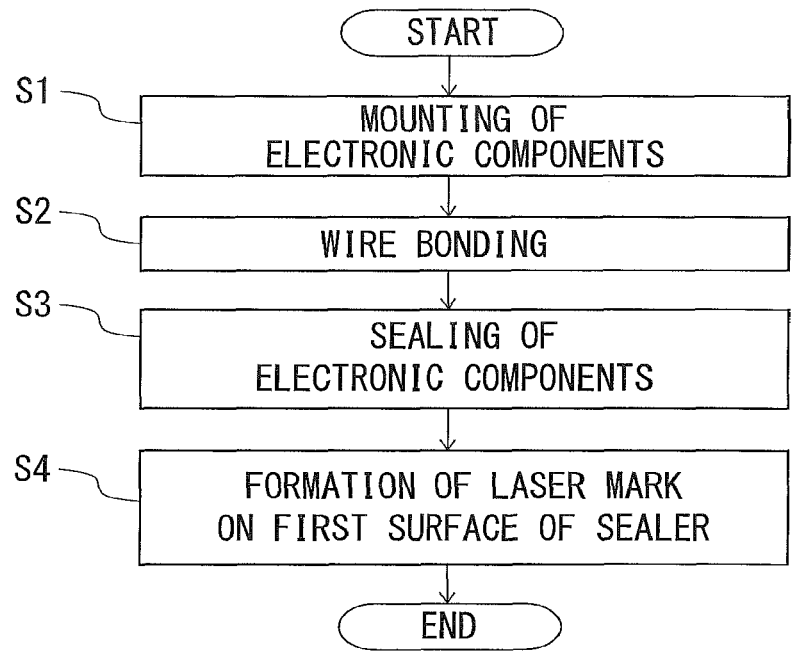
FIG. 4 is a flowchart of a manufacturing method of the semiconductor storage device showing the first embodiment.

Next, a manufacturing method of the semiconductor storage device 1 in FIG. 1 will be described. FIG. 4 is a flowchart of the manufacturing method of the semiconductor storage device 1 showing the first embodiment.

Initially, the electronic components 3 are mounted on the large-format circuit board 2 (step S1). At this time, by use of the bonding agent 6, such as a DAF, or the like, the electronic components 3 are bonded to the top surface of the circuit board 2 or a top surface of the lower semiconductor chip.

Next, to connect the electronic components 3 to the wirings 22 of the circuit board 2, wire bonding is carried out (step S2).

Next, the electronic components 3 are sealed on the circuit board 2 by the sealer 4 (step S3).

Next, after dicing the circuit board 2 into individual pieces, the laser mark M is formed on the first surface 41a (step S4). The laser mark M may be formed before shipment of the semiconductor storage device 1 or after shipment thereof.

As described above, in the manufacturing process of the semiconductor storage device 1, after the electronic components 3 are sealed by the sealer 4, the laser mark, such as a logotype or a traceability code, is formed on the surface of the sealer 4. In the large-capacity semiconductor storage device 1 in which the plurality of memory chips are laminated, for making the thickness of the semiconductor storage device 1 satisfy the standard dimension, thickness of the sealer 4 on the memory chips is reduced. If the laser mark M is formed on the surface of the thin sealer 4 on the memory chips, there is a possibility that the memory chips are damaged by the laser, and thereby the characteristics and the reliability of the semiconductor storage device 1 are deteriorated.

In contrast thereto, according to the manufacturing method of the semiconductor storage device 1 showing the first embodiment, since it is possible to avoid the damage to the laminated chip 31 or the wirings 22 by forming the laser mark M on the first surface 41a that does not face the memory chip, the characteristics and the reliability of the semiconductor storage device 1 can be secured. Moreover, it becomes also possible to improve yields in manufacturing the semiconductor storage device 1.

(Second Embodiment)

Figure 5:
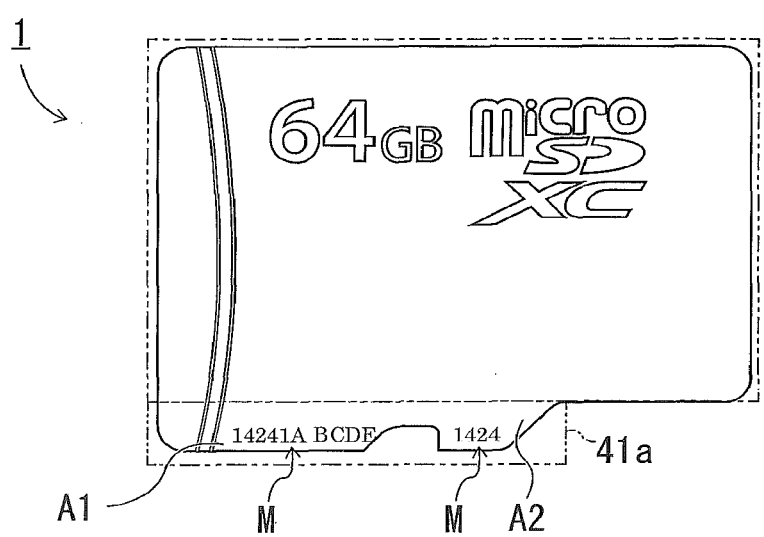
FIG. 5 is a plan view of a semiconductor storage device showing a second embodiment.

Next, a second embodiment will be described with a focus on different points from the first embodiment. FIG. 5 is a plan view of a semiconductor storage device 1 showing the second embodiment.

In the first embodiment, the laser mark M was formed only on the first region A1 of the first surface 41a. In contrast thereto, in the second embodiment, the laser mark M is also formed on the second region A2 of the first surface 41a.

According to the second embodiment, even if the laser marks M are formed on a plurality of locations, it is possible to secure characteristics and reliability of the semiconductor storage device 1. Moreover, since the laser marks M can be provided to a plurality of locations, it becomes possible to grasp a distribution status of the semiconductor storage device 1 in more detail.

(Third Embodiment)

Figure 6:
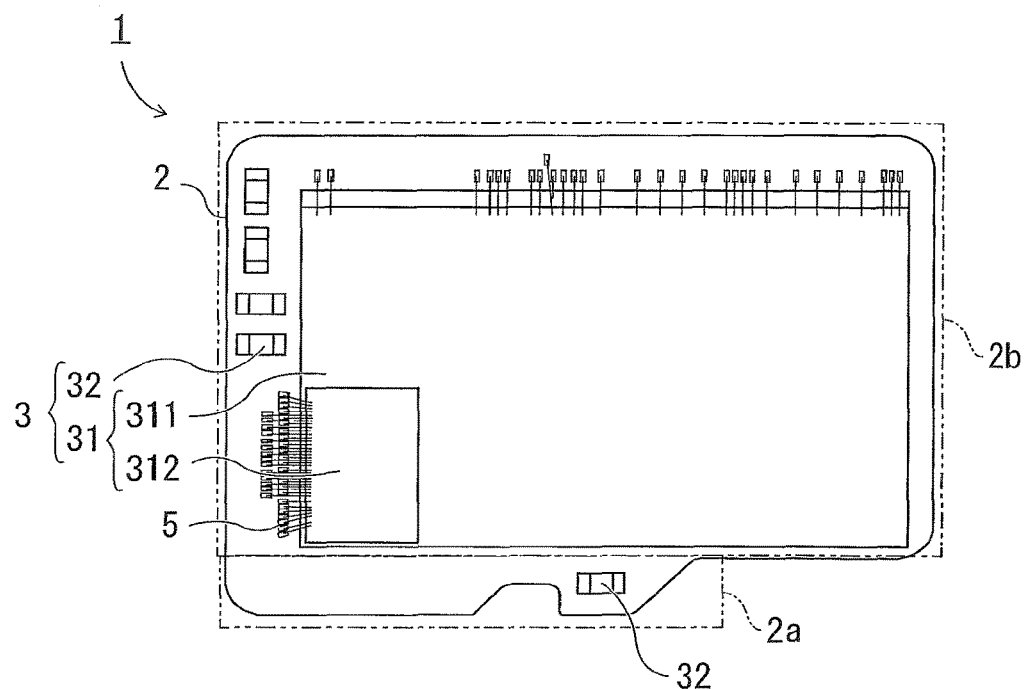
FIG. 6 is a plan view of an inside of a semiconductor storage device showing a third embodiment.

Next, a third embodiment will be described with a focus on different points from the first embodiment. FIG. 6 is a plan view of an inside of a semiconductor storage device 1 showing the third embodiment. In the first embodiment, the electronic components 3 are not mounted on the first substrate section 2a. In contrast thereto, in the third embodiment, the passive component 32 is mounted on the first substrate section 2a. In other words, the first surface 41a faces the passive component 32 with spacing of a threshold or more.

The passive component 32 is thin as compared to the laminated chip 31. Since the passive component 32 is thin, the sealer 4 on the passive component 32 can be formed with sufficient thickness. Due to the sufficient thickness of the sealer 4, when the laser mark M is formed on the first surface 41a, the laser hardly penetrates the sealer 4. Accordingly, even if the laser mark M is formed on the first surface 41a, the passive component 32 is hardly damaged.

According to the third embodiment, similar to the first embodiment, even if the laser marks M is formed, it is possible to secure characteristics and reliability of the semiconductor storage device 1. Moreover, according to the third embodiment, it is possible to improve a degree of flexibility in layout of the passive component 32.

(Fourth Embodiment)

Figure 7:
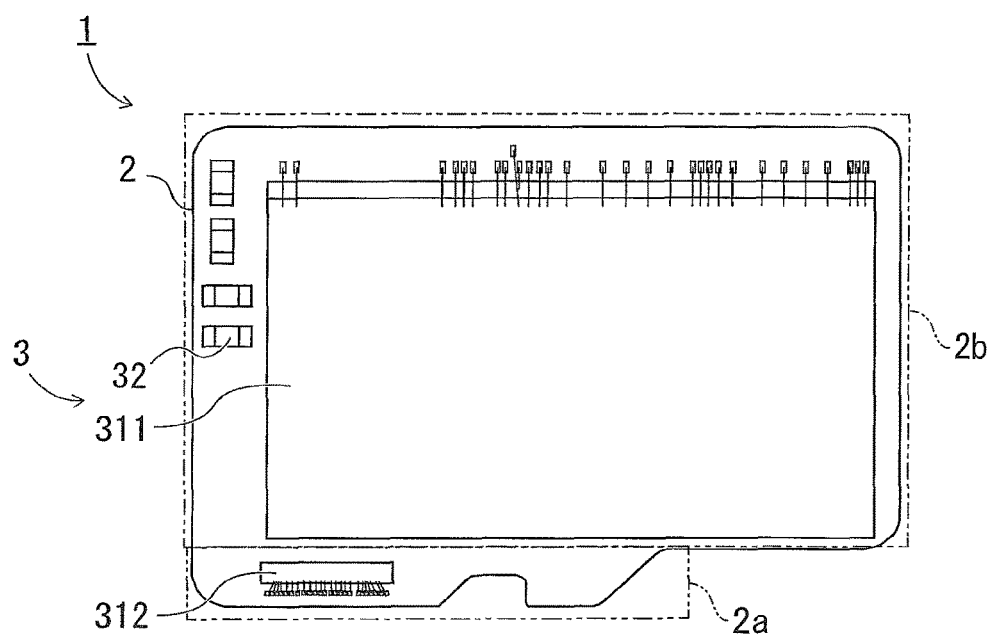
FIG. 7 is a plan view of an inside of a semiconductor storage device showing a fourth embodiment.

Next, a fourth embodiment will be described with a focus on different points from the first embodiment. FIG. 7 is a plan view of an inside of a semiconductor storage device 1 showing the fourth embodiment. In the first embodiment, an uppermost layer of the laminated chip 31 is configured with the controller chip 312. In contrast thereto, in the fourth embodiment, the controller chip 312 is mounted on the first substrate section 2a. The first surface 41a faces the controller chip 312, namely, a second semiconductor chip, with spacing of a threshold or more.

The controller chip 312, as a single piece itself, is thin as compared to the laminated chip 31. Since the controller chip 312 is thin, the sealer 4 on the controller chip 312 can be formed with sufficient thickness. Due to the sufficient thickness of the sealer 4, when the laser mark M is formed on the first surface 41a, the laser hardly penetrates the sealer 4, and accordingly, the controller chip 312 is hardly damaged.

According to the fourth embodiment, similar to the first embodiment, even if the laser marks M is formed, it is possible to secure characteristics and reliability of the semiconductor storage device 1. Moreover, according to the fourth embodiment, it is possible to improve a degree of flexibility in layout of the controller chip 312. In addition, according to the fourth embodiment, it is possible to delete the controller chip 312 which was positioned at the uppermost layer of the laminated chip 31 in the first embodiment.

Consequently, in the laminated chip 31, instead of providing the controller chip 312, it is possible to increase the number of layers in the NAND chip 311 by one, to thereby increase the memory capacity further.

Note that the first to fourth embodiments may be appropriately combined.

It is possible to apply the present embodiments to seal electronic components on a lead frame by a metal sealer.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device being capable of being inserted to a socket of a host device, the semiconductor storage device comprising:
a substrate comprising wiring, a first substrate section, and a second substrate section;
a first semiconductor chip that is connected to the wiring on the second substrate section;
a sealer that comprises a first surface, and a second surface and seals the first semiconductor chip, the first surface not facing a top surface of the first semiconductor chip, the second surface facing a top surface of the first semiconductor chip, the first surface being connected to the second surface and being shorter than the second surface in an inserting direction into the socket; and
a mark being provided on the first surface of the sealer.

2. The semiconductor storage device according to claim 1, wherein
the first semiconductor chip is a laminated chip in which a plurality of semiconductor chips are laminated, and
a recessed section that fastens the semiconductor storage device to a host device exists in the first surface.

3. The semiconductor storage device according to claim 2, wherein the first surface does not face an electronic component.

4. The semiconductor storage device according to claim 2, further comprising a passive component.

5. The semiconductor storage device according to claim 2, further comprising a second semiconductor chip.

6. The semiconductor storage device according to claim 2, wherein
the first surface comprises a first region and a second region sandwiching the recessed section, and
the mark is provided to at least one of the first region and the second region.

7. The semiconductor storage device according to claim 1, wherein the mark is an engraving by a laser.

8. The semiconductor storage device according to claim 1, wherein the sealer comprises a resin.

9. The semiconductor storage device according to claim 1, wherein the substrate is a printed wiring board.

10. The semiconductor storage device according to claim 1, wherein the first semiconductor chip comprises at least one of a memory chip and a controller chip.

11. The semiconductor storage device according to claim 5, wherein the second semiconductor chip is one of a memory chip and a controller chip.

12. The semiconductor storage device according to claim 1, wherein
the first surface of the sealer extends beyond an edge of the second substrate section.

* * * * *